(12) United States Patent
Donth et al.

(10) Patent No.: US 9,066,454 B2
(45) Date of Patent: Jun. 23, 2015

(54) INVERTER WITH ENCLOSURE

(75) Inventors: Andreas Donth, Edermuende-Besse (DE); Thorsten Hobein, Fuldatal (DE); Bernd Gebert, Kassel (DE)

(73) Assignee: SMA Solar Technology AG, Niestetal (DE)

( * ) Notice: Subject to any disclaimer, the term of this patent is extended or adjusted under 35 U.S.C. 154(b) by 398 days.

(21) Appl. No.: 13/419,905

(22) Filed: Mar. 14, 2012

(65) Prior Publication Data

US 2012/0182689 A1    Jul. 19, 2012

Related U.S. Application Data

(63) Continuation of application No. PCT/EP2010/005574, filed on Sep. 10, 2010.

(51) Int. Cl.
*H05K 7/20* (2006.01)
*H02M 7/00* (2006.01)
*H01L 23/473* (2006.01)

(52) U.S. Cl.
CPC ........... *H05K 7/20909* (2013.01); *H02M 7/003* (2013.01)

(58) Field of Classification Search
CPC ................. G06F 1/16–1/1654; G06F 1/1656; G06F 1/1662–1/1681; G06F 1/1684–1/189; G06F 1/20; G06F 1/203; G06F 1/206; G06F 2200/201; G06F 2200/202; G06F 2200/203; H05K 5/0026–5/0082; H05K 7/005–7/08; H05K 7/1422; H05K 5/00–5/0021; H05K 5/0086–5/06; H05K 5/069; H05K 7/20; H05K 1/0218–1/0219; H05K 1/00; H05K 3/00; H05K 7/00; H05K 9/00; H05K 7/2089–7/20945; H05K 7/20218; H05K 7/20254; H01G 2/00; H01G 4/00; H01G 5/00; H01G 7/00; H01G 9/00–9/155; H01G 11/00; H02G 3/00; H02G 5/00; H02G 7/00; H02G 9/00; H02G 11/00; H02G 13/00; H02G 15/00; H01B 7/00; H01B 11/00; H01B 17/00; H02B 1/00; H01R 4/00; H01R 9/00; H01R 13/00; H01K 1/00–3/00; H01H 37/00; H01L 23/473
USPC ............... 361/725, 679.46–679.54, 688–723; 165/80.2–80.3, 185, 80.1–80.5, 165/104.33; 174/16.1–16.3, 15.1–15.2; 417/360; 363/141; 257/712–722
See application file for complete search history.

(56) References Cited

U.S. PATENT DOCUMENTS 5,170,336 A * 12/1992 Getter et al. .................. 363/141
5,437,041 A *  7/1995 Wakabayashi et al. ....... 361/714

(Continued)

FOREIGN PATENT DOCUMENTS

EP    1657797 A1    5/2006
EP    1995861 A1   11/2008

OTHER PUBLICATIONS

International Search Report dated Dec. 14, 2010 for International Application No. PCT/EP2010/005574. 3 Pages.

*Primary Examiner* — Michail V Datskovskiy
*Assistant Examiner* — Razmeen Gafur
(74) *Attorney, Agent, or Firm* — Eschweiler & Associates, LLC

(57) ABSTRACT

The invention relates to an inverter with an enclosure that includes a removable hand plug which, when inserted inside the enclosure, shares an electrical connection with the inverter. The hand plug includes a fan configured to cool at least a portion of the inverter enclosure.

18 Claims, 3 Drawing Sheets

(56) References Cited

U.S. PATENT DOCUMENTS

| | | | |
|---|---|---|---|
| 5,497,289 A * | 3/1996 | Sugishima et al. | 361/709 |
| 6,091,604 A * | 7/2000 | Plougsgaard et al. | 361/707 |
| 6,411,514 B1 * | 6/2002 | Hussaini | 361/704 |
| 7,009,841 B2 * | 3/2006 | Chen et al. | 361/695 |
| 7,187,568 B2 * | 3/2007 | Radosevich et al. | 363/144 |
| 7,338,311 B2 | 3/2008 | Laschinksi et al. | |
| 7,397,653 B2 * | 7/2008 | Taylor | 361/676 |
| 7,626,818 B2 * | 12/2009 | Yoshida et al. | 361/695 |
| 8,035,045 B2 * | 10/2011 | Bremicker et al. | 200/43.04 |
| 2007/0274042 A1 * | 11/2007 | Jackson et al. | 361/695 |
| 2007/0279864 A1 * | 12/2007 | Hirota et al. | 361/697 |
| 2007/0279865 A1 * | 12/2007 | Yoshida et al. | 361/697 |
| 2008/0130223 A1 * | 6/2008 | Nakamura et al. | 361/689 |
| 2008/0198548 A1 * | 8/2008 | Nakamura et al. | 361/689 |
| 2008/0225487 A1 * | 9/2008 | Nakajima et al. | 361/699 |
| 2009/0016018 A1 * | 1/2009 | Kunkle | 361/695 |
| 2009/0109713 A1 * | 4/2009 | Schnetzka et al. | 363/34 |
| 2009/0201642 A1 * | 8/2009 | Diaz | 361/695 |
| 2009/0231811 A1 * | 9/2009 | Tokuyama et al. | 361/699 |

* cited by examiner

INVERTER WITH ENCLOSURE

REFERENCE TO RELATED APPLICATIONS

This application is a continuation of International Application No. PCT/EP2010/005574, filed Sep. 10, 2010, which claims priority to European Application Number 09011910.8-2214, filed Sep. 18, 2009.

FIELD

The present invention relates to an inverter with an enclosure that features a removable hand plug which, when inserted inside the enclosure, shares an electrical connection with the inverter.

BACKGROUND

The technology behind inverters is well documented. Inverters typically feature an enclosure whose back panel is mounted to the wall of a building or other structure. Due to the electric and electronic components (e.g. coils) inside the enclosure, the inverter generates heat that needs to be dissipated. The inverter enclosure is therefore outfitted with fans that cool the component parts within. In addition, the back panel of this type of inverter typically features cooling fins that also help to dissipate heat. Heat is thereby absorbed by the ambient air that flows along the back panel of the enclosure.

This type of inverter can also feature fans on the back panel of the enclosure to facilitate air circulation and thus allow for improved cooling of the area around the back panel. Because these fans require power, they must be supplied with electricity from the inside of the inverter enclosure via a plug. The hole through which the plug is inserted into the enclosure always poses the risk of moisture ingress.

This type of fan can become dirty and the only way to access the fan for cleaning or replacement is from the back panel, which means the entire inverter needs to be removed from the wall first.

The upshot of this is that, for a variety of applications, the fans on the back panel need to be mounted externally so as to ensure sufficient inverter cooling while also allowing easy access for cleaning purposes when the back panel of the inverter is attached to a wall.

One disadvantage of this configuration is that it requires an entry way or opening to the inside of the inverter in order to supply power to the fan. This naturally increases the risk of moisture entering the enclosure.

SUMMARY

In one embodiment an inverter is disclosed that allows easy replacement of the fan.

In one embodiment the hand plug itself contains a fan to cool the inverter enclosure. This hand plug protrudes into the area of the back panel of the inverter enclosure so that the air circulated by the fan flows along the back panel.

Based on one embodiment of this invention, the hand plug is used to supply power to the fan.

Since the hand plug, when inserted into the inverter enclosure, is supplied with electricity, i.e., shares an electrical connection with the inverter, a separate power supply for the fan is not necessary. This also obviates the need for a separate opening into the inverter enclosure to power the fan.

According to one advantageous property of this invention, the hand plug is designed to function as a switch-disconnector.

As documented in DE 102 25 259 B3, a connector can be designed as a switch-disconnector. The switch-disconnector described in this document is capable of preventing, or at least reducing, the occurrence of electric arcs when, for example, the inverter is disconnected from a PV plant. Therefore the switch-disconnector, which is designed as the hand plug, shares an electrical connection with the inverter. This means that the hand plug can supply power to the fan. This also means, however, that removing the hand plug to disconnect the inverter from the PV plant will de-energize the inverter on the DC side at least. Removing the hand plug allows the fan to be accessed for cleaning or replacement. The primary benefit of this embodiment is that no separate power supply is necessary, which would otherwise require an additional opening in the inverter enclosure.

Advantageous properties of the invention involve having the hand plug accommodate a fan enclosure so that the fan can be inserted easily. As a further advantage of this feature, the fan enclosure can be removed by simply pulling out the hand plug. This type of modular design simplifies the mounting process.

Based on one advantageous property, the back panel of the inverter features a chimney-like section that extends along the entire length of the enclosure. When the hand plug is inserted, the fan will be located in the vicinity of this section. The chimney-like section forms a connection with the wall where the inverter is attached and is outfitted with cooling fins through which the air is circulated by the fan flows.

BRIEF DESCRIPTION OF THE DRAWINGS

The drawings below provide a more detailed description of the invention.

DETAILED DESCRIPTION

Figure 1:
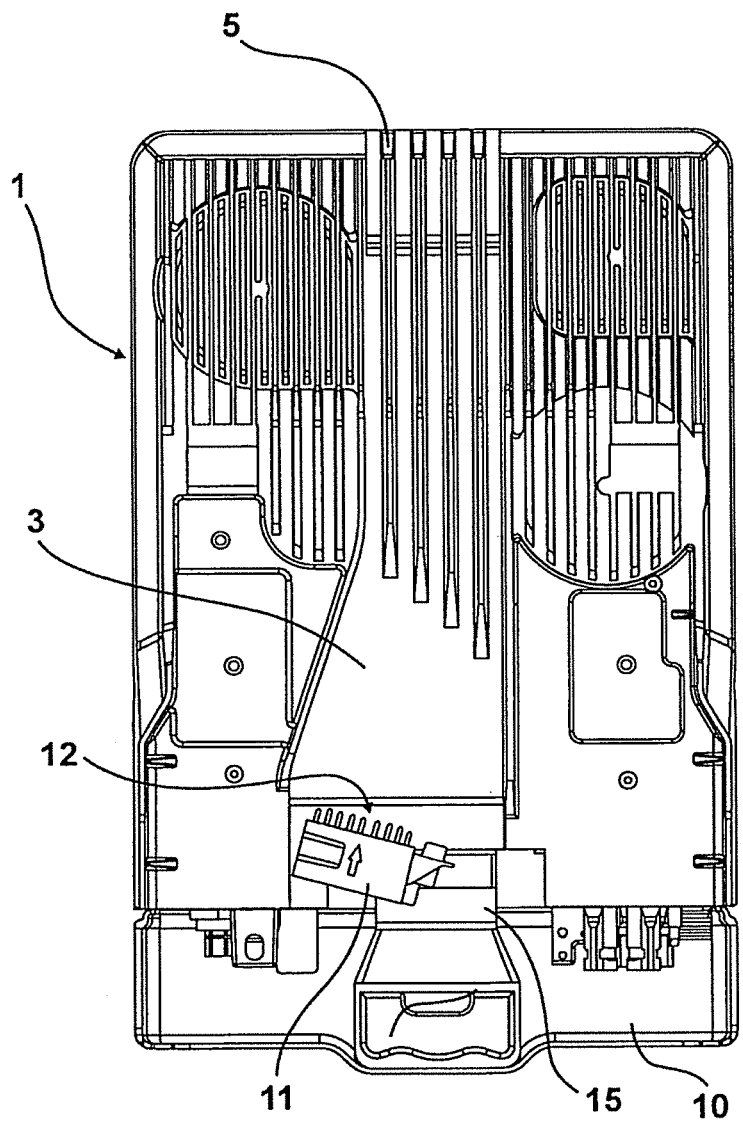
FIG. 1 depicts the back panel of the inverter enclosure when the hand plug is inserted according to one embodiment.

According to FIG. 1, the enclosure of the inverter is designated at reference numeral 1. The inverter enclosure 1 shows the hand plug, which is designated at 10, on the bottom. The hand plug 10 accommodates the fan enclosure 11 and the fan 12 contained therein. The fan 12 is aligned in its enclosure 11 in such a way that the fresh air drawn from below is blown into the chimney-like section 3 on the back panel of the enclosure 1. The chimney-like section 3 is designed with a U-shaped cross-section in one embodiment that is aligned towards the interior of the inverter enclosure. Near this chimney-like section there are cooling fins 5 that help dissipate the heat generated inside the enclosure.

Figure 2:
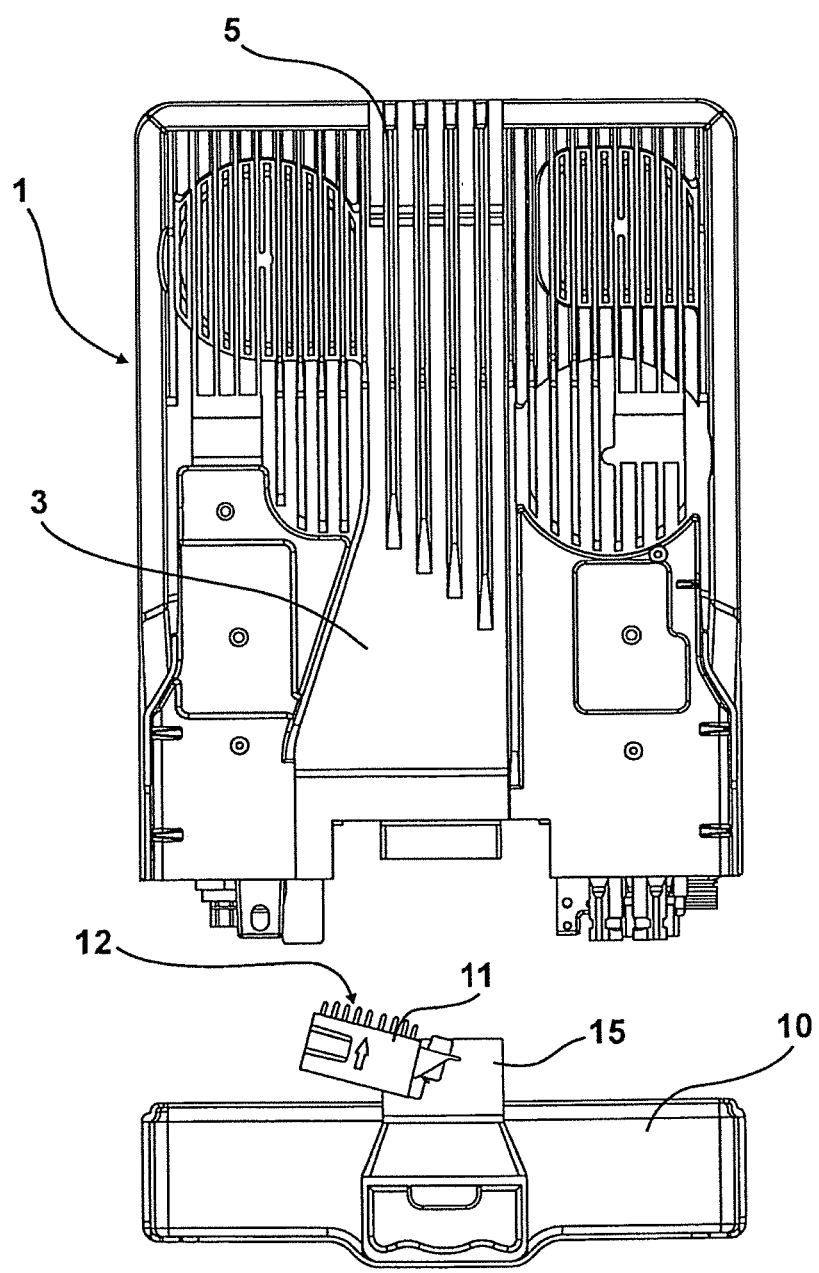
FIG. 2 depicts the back panel of the inverter enclosure when the hand plug is removed according to one embodiment.

FIG. 2 illustrates the inverter enclosure 1, wherein the hand plug 10 at the bottom portion thereof is removed.

Figure 3:
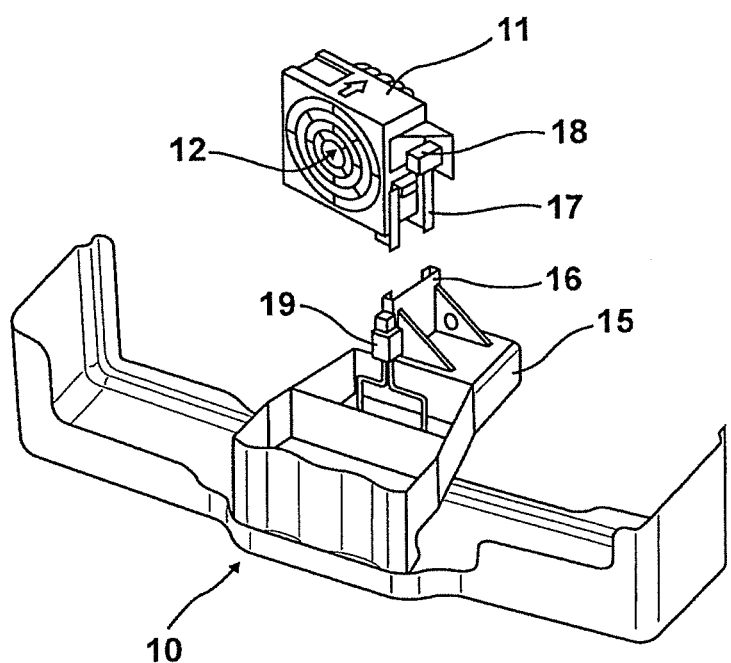
FIG. 3 offers a perspective view of the hand plug in which the fan enclosure, which contains the fan, is shown separately.

In FIG. 3, the fan enclosure 11 can be seen along with the fan 12 contained therein. The fan 12 is attached to the fan enclosure 11 via a snap-in connection. The hand plug 10 features a bracket 15 with a guide rail 16 that allows the fan enclosure 11 to be attached as depicted in FIG. 3. Likewise depicted is the area around the guide rail 16 and sliding element 17 of the fan enclosure where the plug 18 that powers the fan is located and which is connected to the plug 19 on the bracket 15 of the hand plug 10. The hand plug 10 is part of the bottom panel of the inverter enclosure 1 and is removed by pulling it down, as shown in FIG. 2.

What is claimed is:

1. An inverter, comprising:
an enclosure configured to house inverter components of the inverter, and
a removable hand plug configured to be inserted into the enclosure and shares an electrical connection with one or more of the inverter components within the enclosure, wherein the removable hand plug comprises a fan configured to cool at least a portion of the enclosure, wherein the hand plug is configured as a switch-disconnector configured to selectively de-energize at least a direct current side of the inverter.

2. The inverter according to claim 1, wherein the hand plug is configured to supply power to the fan.

3. The inverter according to claim 1, wherein the hand plug comprises a fan enclosure configured to secure an orientation of the fan when the hand plug is inserted into the enclosure.

4. The inverter according to claim 3, wherein the fan enclosure comprises a sliding element configured to slidingly engage a guide rail associated with the hand plug.

5. An inverter, comprising:
an enclosure;
one or more inverter elements configured to receive direct current energy and generate alternating current energy in response thereto; and
a removable hand plug configured to be selectively inserted into the enclosure, wherein the removable hand plug comprises a fan configured to cool at least a portion of the one or more inverter elements in the enclosure when the removable hand plug is inserted into the enclosure, and wherein the removable hand plug is configured as a switch-disconnector configured to selectively disconnect at least the direct current energy to the inverter upon removal of the removable hand plug from the inverter.

6. The inverter of claim 5, wherein the fan is configured to receive power from at least one of the one or more inverter elements when the removable hand plug is inserted into the enclosure.

7. The inverter of claim 5, wherein the removable hand plug comprises a bracket to which the fan engages in a secure fashion.

8. The inverter of claim 7, wherein the bracket comprises a pair of guide rails configured to engage the fan.

9. The inverter of claim 8, wherein the fan comprises a sliding element configured to slidingly engage the pair of guide rails to secure the fan to the bracket.

10. The inverter of claim 9, wherein the fan comprises a plug configured to make an electrical connection to a source of power associated with the one or more inverter elements when the sliding element of the fan slidingly engages the guide rails to secure the fan to the bracket.

11. An inverter, comprising:
an enclosure configured to house inverter components of the inverter, and
a removable hand plug configured to be inserted into the enclosure and shares an electrical connection with one or more of the inverter components within the enclosure, wherein the removable hand plug comprises a fan configured to cool at least a portion of the enclosure, and wherein the hand plug is configured as a switch-disconnector configured to selectively de-energize at least a direct current side of the inverter.

12. The inverter of claim 11, wherein the removable hand plug is configured to supply power to the fan.

13. The inverter of claim 11, wherein the removable hand plug comprises a fan enclosure configured to secure an orientation of the fan when the hand plug is inserted into the enclosure.

14. The inverter of claim 13, wherein the fan enclosure comprises a sliding element configured to slidingly engage a guide rail associated with the removable hand plug.

15. The inverter of claim 11, wherein a back panel portion of the enclosure comprises a chimney-like section that extends along the entire length thereof, wherein when the removable hand plug is inserted into the enclosure, the fan is located in a vicinity of the chimney-like section for fluid communication thereto.

16. The inverter of claim 11, wherein the switch-disconnector is further configured to prevent or reduce electrical arcing upon a disconnection of the removable hand plug from a direct current energy source to inverter.

17. An inverter, comprising:
an enclosure configured to house inverter components of the inverter, and
a removable hand plug configured to be inserted into the enclosure and shares an electrical connection with one or more of the inverter components within the enclosure, wherein the removable hand plug comprises a fan configured to cool at least a portion of the enclosure, wherein a back panel portion of the enclosure comprises a chimney-like section that extends along the entire length thereof, wherein when the hand plug is inserted into the enclosure, the fan is located in a vicinity of the chimney-like section for fluid communication thereto, and wherein the hand plug is configured as a switch-disconnector configured to prevent or reduce electrical arcing upon a disconnection of the hand plug from a direct current energy source to inverter.

18. The inverter according to claim 17, wherein the switch-disconnector is further configured to selectively de-energize at least a direct current side of the inverter.

* * * * *